United States Patent
Ko et al.

(10) Patent No.: US 7,270,136 B2
(45) Date of Patent: Sep. 18, 2007

(54) APPARATUS FOR CLEANING THE EDGES OF WAFERS

(75) Inventors: Se-Jong Ko, Pyeongtaek-shi (KR); Jung-Gwan Kim, Cheonan-shi (KR); Cheol-Nam Yoon, Ansong-shi (KR); Jeong-Ho Lee, Inchon Metropolitan (KR)

(73) Assignee: K. C. Tech Co., Ltd., Kyonggi-Do (KR)

(*) Notice: Subject to any disclaimer, the term of this patent is extended or adjusted under 35 U.S.C. 154(b) by 561 days.

(21) Appl. No.: 10/450,430

(22) PCT Filed: Dec. 14, 2001

(86) PCT No.: PCT/KR01/02169

§ 371 (c)(1),
(2), (4) Date: Jun. 12, 2003

(87) PCT Pub. No.: WO02/49085

PCT Pub. Date: Jun. 20, 2002

(65) Prior Publication Data

US 2004/0035450 A1 Feb. 26, 2004

(30) Foreign Application Priority Data

Dec. 15, 2000 (KR) .............................. 2000-77114

(51) Int. Cl.
*B08B 3/02* (2006.01)

(52) U.S. Cl. ..................... 134/148; 134/157; 134/198; 134/902

(58) Field of Classification Search ................ 134/148, 134/157, 902, 198
See application file for complete search history.

(56) References Cited

U.S. PATENT DOCUMENTS

| | | | | |
|---|---|---|---|---|
| 4,968,375 A | * | 11/1990 | Sato et al. | 156/345.23 |
| 5,062,898 A | * | 11/1991 | McDermott et al. | 134/7 |
| 5,364,474 A | | 11/1994 | Williford, Jr. | 134/32 |
| 5,608,943 A | * | 3/1997 | Konishi et al. | 15/302 |
| 5,616,067 A | * | 4/1997 | Goenka | 451/39 |
| 5,679,062 A | * | 10/1997 | Goenka | 451/75 |

(Continued)

FOREIGN PATENT DOCUMENTS

JP 4-206521 7/1992

(Continued)

OTHER PUBLICATIONS

Patent Abstracts of Japan, Publication No. 11-000625, Publication Date Jun. 1, 1999, 2 pages.

(Continued)

*Primary Examiner*—Frankie L. Stinson
(74) *Attorney, Agent, or Firm*—Osha Liang LLP

(57) ABSTRACT

The invention concerns an apparatus for cleaning the edge of a wafer that may be relatively simply constructed with low cost, and prevent the wafer from being re-contaminated by the edge cleaning, thus resulting in increase of the yield rate of wafers. The apparatus includes a cleaning agent ejection nozzle body provided on a side part of a chuck for ejecting a particulate cleaning agent ($CO_2$ particles) towards the side and the edge portions of the wafer held and rotated by the chuck, and a nozzle body carriage for moving the nozzle body between rest and cleaning positions.

9 Claims, 9 Drawing Sheets

U.S. PATENT DOCUMENTS

| | | | |
|---|---|---|---|
| 5,711,818 A * | 1/1998 | Jain | 134/6 |
| 5,729,856 A * | 3/1998 | Jang et al. | 15/88.1 |
| 5,782,253 A * | 7/1998 | Cates et al. | 134/105 |
| 5,822,818 A | 10/1998 | Chao et al. | 8/158 |
| 5,853,128 A * | 12/1998 | Bowen et al. | 239/329 |
| 5,853,803 A * | 12/1998 | Tateyama et al. | 427/240 |
| 5,868,003 A * | 2/1999 | Simas et al. | 62/603 |
| 5,939,139 A * | 8/1999 | Fujimoto | 427/240 |
| 5,952,050 A * | 9/1999 | Doan | 427/336 |
| 5,976,267 A | 11/1999 | Culkins et al. | 134/6 |
| 5,993,547 A * | 11/1999 | Sato | 118/50 |
| 5,993,552 A * | 11/1999 | Tsukamoto et al. | 118/319 |
| 6,015,467 A * | 1/2000 | Nagasawa et al. | 134/1 |
| 6,059,893 A * | 5/2000 | Kawasaki | 134/37 |
| 6,062,288 A * | 5/2000 | Tateyama | 156/584 |
| 6,079,428 A * | 6/2000 | Anai | 134/172 |
| 6,159,288 A * | 12/2000 | Satou et al. | 118/70 |
| 6,202,658 B1 * | 3/2001 | Fishkin et al. | 134/147 |
| 6,203,406 B1 * | 3/2001 | Rose et al. | 451/39 |
| 6,238,511 B1 * | 5/2001 | Sada et al. | 156/344 |
| 6,332,470 B1 * | 12/2001 | Fishkin et al. | 134/102.1 |
| 6,453,916 B1 * | 9/2002 | Tran et al. | 134/58 R |
| 6,475,293 B1 * | 11/2002 | Moinpour et al. | 134/6 |
| 6,516,815 B1 * | 2/2003 | Stevens et al. | 134/25.4 |
| 6,523,553 B1 * | 2/2003 | Redeker et al. | 134/61 |
| 6,565,920 B1 * | 5/2003 | Endisch | 427/240 |
| 6,676,757 B2 * | 1/2004 | Kitano et al. | 118/676 |
| 6,793,764 B1 * | 9/2004 | Doan | 156/345.17 |
| 6,847,777 B1 * | 1/2005 | Nakamura | 386/46 |
| 6,851,435 B2 * | 2/2005 | Mertens et al. | 134/99.1 |

FOREIGN PATENT DOCUMENTS

| | | |
|---|---|---|
| JP | 6-295895 | 10/1994 |
| JP | 11-625 | 1/1999 |
| KR | 2000-0052044 | 8/2000 |

OTHER PUBLICATIONS

Patent Abstracts of Japan, Publication No. 04-206521, Publication Date Jul. 28, 1992, 2 pages.
Korean Patent Abstracts; Publication No. 1020000052044 dated Aug. 16, 2000 (2 pgs.).
English Abstract of Japanese Patent Application No. 6-295895.

* cited by examiner

APPARATUS FOR CLEANING THE EDGES OF WAFERS

TECHNICAL FIELD

The present invention concerns an apparatus for cleaning wafers, and more particularly an apparatus for cleaning the edges and sides of wafers by applying solid fine volatile particles such as dry ice.

BACKGROUND ART

The process for fabricating a semiconductor device employs an apparatus for cleaning a semiconductor wafer (hereinafter referred to simply as wafer) on whose surface is provided a thin film circuit pattern.

A conventional apparatus for cleaning a wafer is illustrated in FIG. 1. The apparatus includes a spin chuck 10 for substantially horizontally supporting a wafer (W) by suction and rotating it, and a treatment liquid supply nozzle 30 arranged above the rotational center of the spin chuck to supply a cleaning or treatment liquid on the surface of the wafer (W).

Firstly, a motor not shown drives the spin chuck 20 to rotate the wafer (W) at a given speed. When the rotation is stabilized, the cleaning or treatment liquid is ejected from the nozzle 30 on the surface of the wafer (W) at a given speed to clean or treat it.

If the wafer (W) has both front and back surfaces useful, the wafer (W) is reversed by a reversing mechanism to clean or treat the back surface through the same process after the front surface has been cleaned or treated.

However, although cleaning both front and back surfaces of a wafer, such conventional cleaning apparatus is so designed to make it difficult to clean the edge of a wafer. As the size of a wafer is increased, it becomes more important to remove polymeric residual present in its edge, and there has been conventionally proposed a process of cleaning the edge employing a belt, brush, etc.

One of the processes of cleaning the edge of a wafer employing a brush is proposed in U.S. Pat. No. 5,976,267 granted to Timothy, et al.

This patent, as shown in FIGS. 2A to 2C, a wafer 250 is cleaned by the upper brush 202 moving through a scrubber in the direction indicated by an arrow 701. The lower brush 302 is arranged beneath the wafer 250 directly opposed to the upper brush 202. The upper and lower brushes 202 and 302 are provided with motors to rotate them as well as edge brushes 220 and 320. Two rolls 501 and 502 are provided contacting the side of the wafer at two positions so as to rotate the wafer counterclockwise as indicated by an arrow 702. The rolls 501 and 502 are rotated respectively by stepper motors 503 and 504. The wafer 250 has all its surfaces including the edge cleaned while rotating between the brushes 202, 302, 220 and 320.

Removal of contaminating particles may be facilitated by a water ejector 380 arranged so as to eject water in or near a contact position between the edge brushes 220 and 320 and the wafer, as shown in FIG. 2C. Such a water ejector may be positioned so as to make water flow from a plane aligned with the rotational shaft of the wafer to contact the regions between the wafer and the side scrubbing mechanism. In this case, water may simply move away the particles detached from the wafer by the side scrubbing mechanism, or if having a pressure sufficiently large, directly remove the particles from the wafer. The water ejector may be arranged in a proper place by means of a conventional support structure, and is positioned directly above the wafer in the drawings. The water ejector has a diameter of ⅛ to 1/16 inch, making a water ejection in the form of a sector blade. The edge brushes have bristles 222 and 322 subjected to the ejection of pure water or along with $NH_4OH$ or mixture $NH_4OH/H_2O$ of pure water and $NH_4OH$ to prevent the contaminating particles from being accumulated in the bristles 222 and 322 while cleaning the wafer.

However, such conventional apparatus for cleaning the edge of the wafer employs a plurality of rolls and motors for driving the rolls in order to clean the edge of the wafer, and therefore, has a complicated structure increasing the production cost, and the brushes mechanically constructed may produce physical damages on the wafer by contacting, and moreover, the wafer may be re-contaminated by the cleaning liquid contaminated after cleaning the edge of the wafer, lowering the yield rate of wafers.

DISCLOSURE OF INVENTION

Hence, it is an object of the present invention to provide an apparatus for dry-cleaning the edge of a wafer through an environmentally desirable process using dry ice, which is structurally simplified reducing the production cost and prevents the wafer from being re-contaminated due to the edge cleaning, thus resulting in increase of the yield rate of wafers.

This object is achieved by the inventive apparatus for cleaning the edge of a wafer, which comprises a cleaning agent ejection nozzle body provided on a side part of a chuck for ejecting a particulate cleaning agent towards the side and the edge portions of the wafer held and rotated by the chuck, and a nozzle body carriage for moving the nozzle body between rest and cleaning positions.

The ejection nozzle body is provided with a gas sucker for sucking and treating the gas vaporized from the ejected particulate cleaning agent.

The particulate cleaning agent preferably consists of dry ice ($CO_2$) particles.

Preferably, the nozzle body includes a wafer receiver provided on its front side for receiving an edge portion of the wafer, first nozzles provided in the bottom of the wafer receiver for ejecting the particulate cleaning agent towards the edge of the wafer, second nozzles provided in the upper part of the wafer receiver for ejecting the particulate cleaning agent towards the upper surface of the wafer, and third nozzles provided below the second nozzle for ejecting the particulate cleaning agent towards the lower surface of the wafer.

The nozzles preferably have a diameter of 0.5 to 2 mm.

The nozzle body carriage may comprise a pneumatic cylinder or a stepper motor.

The particulate cleaning agent is carried by a carrier gas such as $N_2$, ejected from the nozzle body towards the edge of the wafer.

The number of each of kind the first, second and third nozzles provided in the nozzle body may be one or more.

In another aspect of the present invention, the object is achieved by an apparatus for cleaning the edge of a wafer, which comprises a cleaning agent storage tank for storing a highly pressurized cleaning agent; a nozzle body connected through a first line with the cleaning agent storage tank and provided in a side part of a spin chuck for holding and rotating the wafer so as to eject the cleaning agent converted into particles, the cleaning agent being depressurized during passing the first line; a carrier gas storage tank connected with a second line connected to the first line for storing a carrier gas to carry the particulate cleaning agent to the nozzle body; a nozzle body carriage for moving the nozzle body between rest and cleaning positions; and a gas sucker for sucking and treating the gas vaporized from the cleaning agent ejected from the nozzle body.

The cleaning agent consists of $CO_2$ particles, and the carrier gas of $N_2$.

The nozzle body includes a wafer receiver provided on its front side for receiving an edge portion of the wafer, first nozzles provided in the bottom of the wafer receiver for ejecting the particulate cleaning agent towards the edge of the wafer, second nozzles provided in the upper part of the wafer receiver for ejecting the particulate cleaning agent towards the upper surface of the wafer, and third nozzles provided below the second nozzle for ejecting the particulate cleaning agent towards the lower surface of the wafer.

The nozzles have a diameter of 0.5 to 2 mm.

The nozzle body carriage may comprise a pneumatic cylinder or a stepper motor.

The number of each kind of the first, second and third nozzles provided in the nozzle body may be one or more.

The carrier gas storage tank is an $N_2$ gas bomb for storing highly pressurized $N_2$ gas.

The carrier gas storage tank stores $N_2$ gas that may be pumped at high pressure by a pump.

The line connector connecting the first and second line comprises a base block for connecting the first and second lines, and orifice and venturi assembly provided between the base block and nozzle body.

BEST MODE FOR CARRYING OUT THE INVENTION

Figure 1:
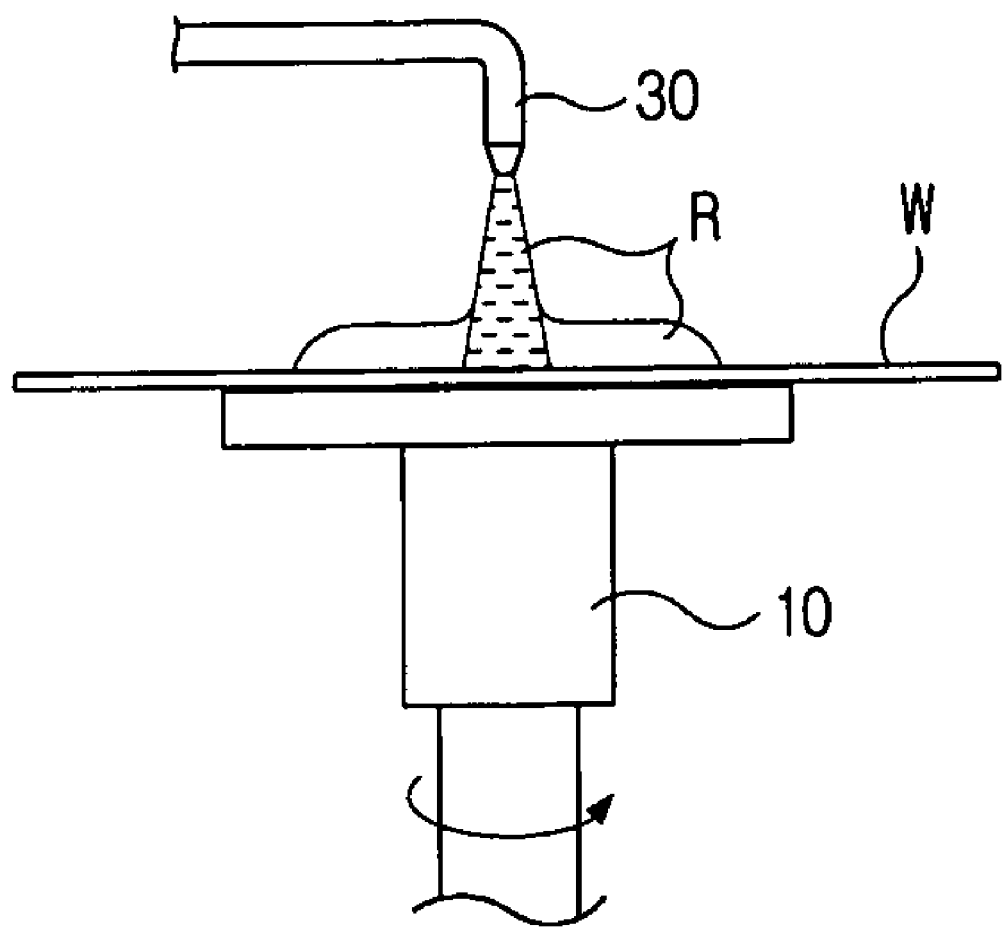
FIG. 1 is a schematic diagram of a conventional wafer cleaning apparatus.
Figure 2A:
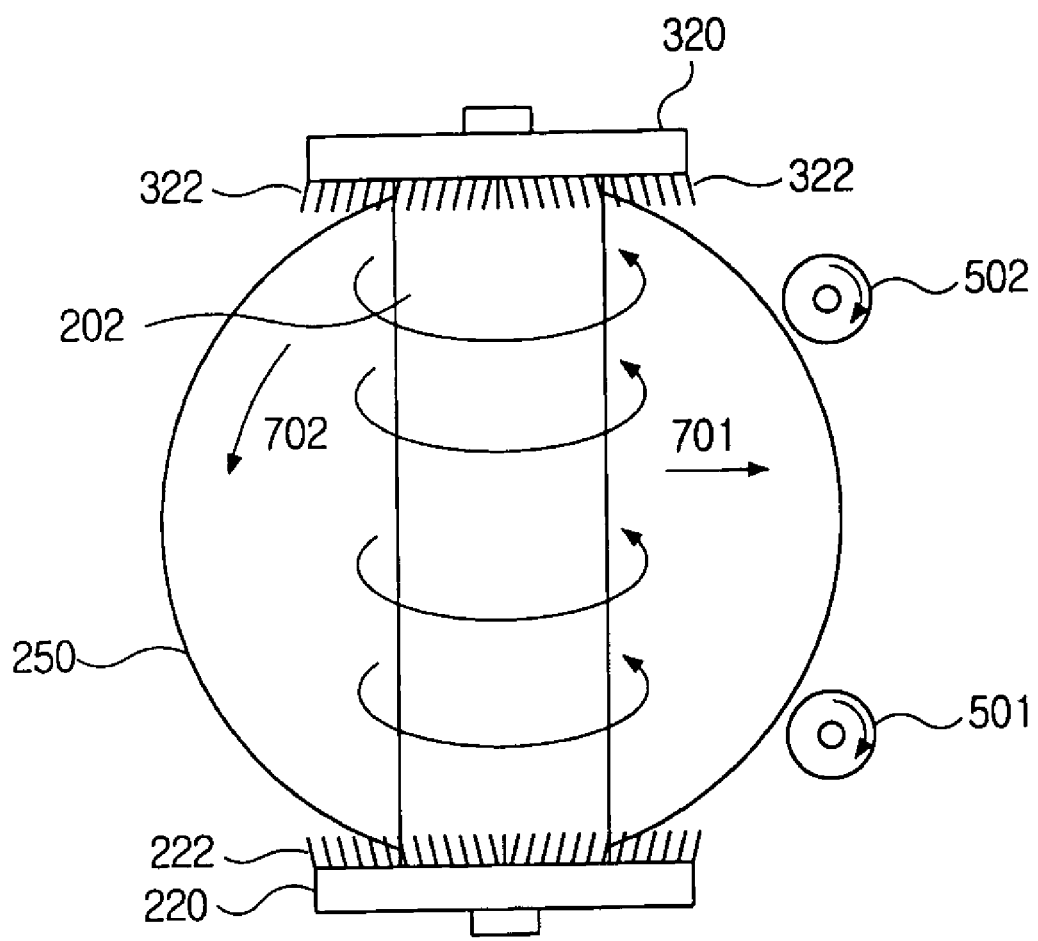
FIGS. 2A to 2C are schematic diagrams for showing the operation of a conventional apparatus for cleaning the edge of a wafer.
Figure 2B:
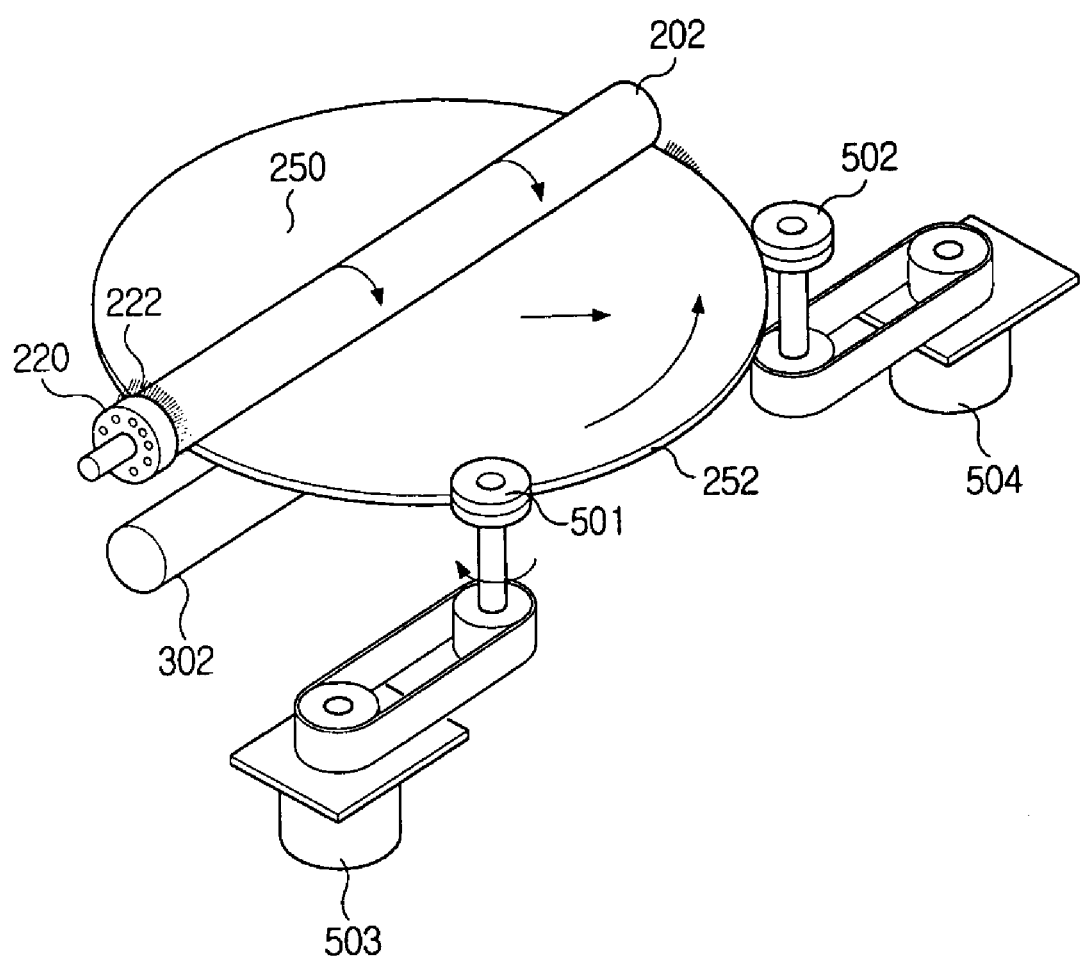
Figure 2C:
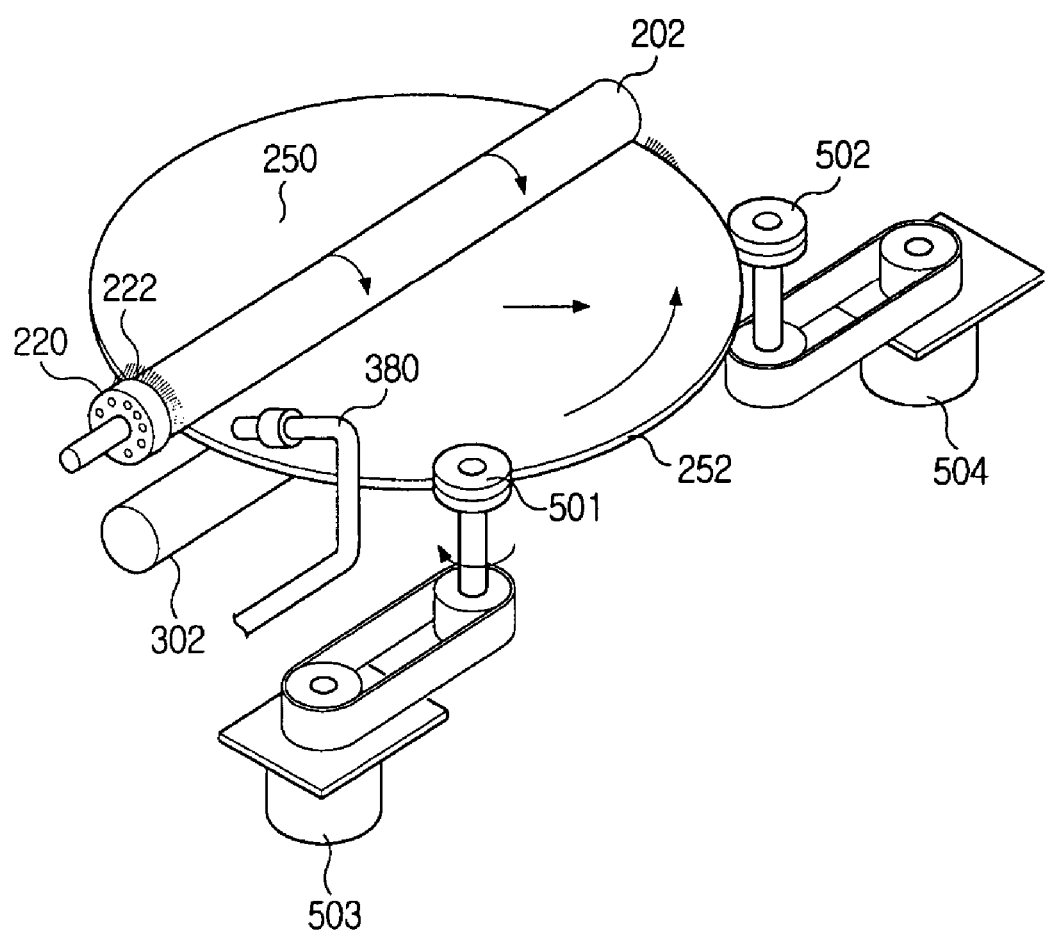
Figure 3:
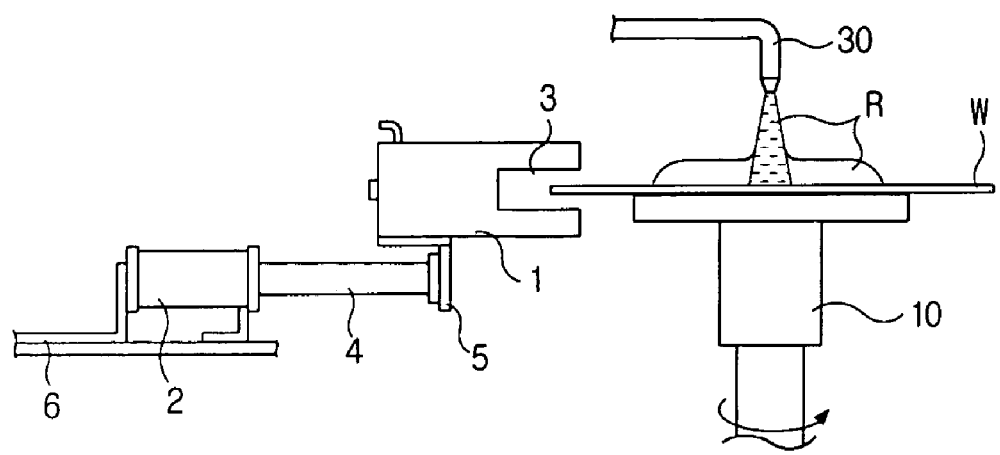
FIG. 3 is a schematic diagram for showing an apparatus for cleaning the edge of a wafer according to the present invention.

FIG. 3 is a schematic diagram for cleaning the edge of a wafer by means of a dry-cleaning process employing dry ice according to the present invention.

As shown in FIG. 3, the inventive apparatus for cleaning the edge of a wafer is provided in a side portion of a wafer (W) held by a spin chuck 10 through suction. The apparatus for cleaning the edge of a wafer comprises a nozzle body 1 for ejecting solidified carbon dioxide $CO_2$, known as dry ice, converted into particles, and a nozzle body carriage 2 for moving the nozzle body 1 between rest and cleaning positions. The nozzle body carriage 2 (hereinafter referred to as pneumatic cylinder) is shown as a pneumatic cylinder by way of illustration, but may consist of a stepper motor. The nozzle body 1 has a lower bracket 5 connected to the piston 4 of the pneumatic cylinder 2, which is mounted through a bracket 6 provided in a side portion of the spin chuck 10 to the cleaning apparatus.

The nozzle body 1 stands by in the rest position when the spin chuck 10 is holding the wafer (W). When the spin chuck 10 has completed the operation of holding the wafer (W), the nozzle body 1 is moved by the forward motion of the pneumatic cylinder 2 to the cleaning position for cleaning the edge of the wafer (W), as shown in FIG. 3. The nozzle body 1 is provided with a wafer receiver 3 for receiving the wafer (W).

Figure 4:
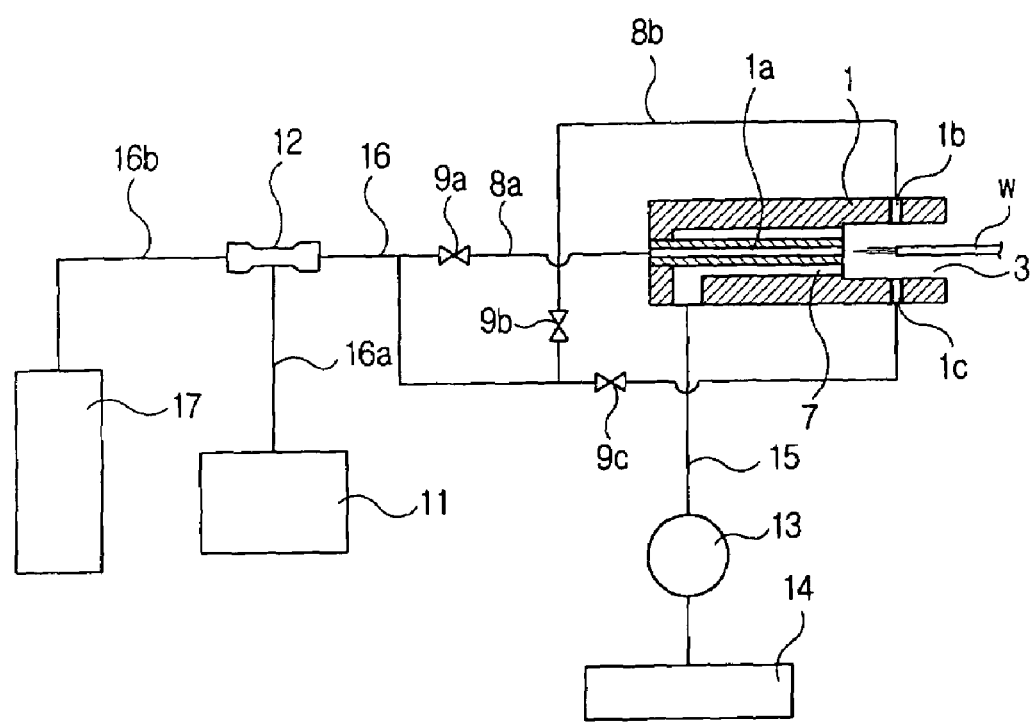
FIG. 4 is a diagram for illustrating the structure of the nozzles for ejecting a cleaning agent towards the upper, lower and side edge portions of the wafer and a circuit for supplying the nozzles with the cleaning agent in the cleaning apparatus shown in FIG. 3.

The nozzle body 1, as shown in FIG. 4, includes a plurality of nozzles 1a, 1b, 1c, of which first nozzles 1a are provided in the bottom of the wafer receiver 3 in order to eject particulate cleaning agent such as dry ice particles (hereinafter referred to as $CO_2$ particles) towards the edge of the wafer (W) Second nozzles 1b are provided in the upper part of the wafer receiver 3 in order to eject $CO_2$ particles towards the upper surface of the wafer (W), and third nozzles 1c positioned below the second nozzles 1b in order to eject $CO_2$ particles towards the lower surface of the wafer (W). These first, second and third nozzles 1a, 1b and 1c have a diameter of 0.5 to 2 mm.

The edge cleaning of the wafer (W) by using $CO_2$ is obtained by the nozzle body 1 that ejects the $CO_2$ particles produced by the phase transformation (transformation from gaseous and liquid to solid phase) of $CO_2$ with pressure and temperature changes towards the wafer (W). The cleaning principle of the $CO_2$ ejection depends on firstly impact energy, secondly thermal contraction between the wafer (W) and $CO_2$ film, thirdly dissolution of contaminants by $CO_2$, finally sublimable volume expansion, etc. These phenomena are caused by the phase transformation (gaseous and liquid phases) of fine dry ice particles when they impinge upon the surfaces of the wafer (W). Hence, such actions of $CO_2$ can eliminate such contaminants as polymer that may be generated in the edge and side portions of the wafer (W) during dry etching. Especially, $CO_2$ cleaning is more desirable in environmental affinity compared to the conventional cleaning process, simplifies the process, and results in good cleaning effect with the inherently excellent dissolution power to organic substances of hydrocarbon series.

The first, second and third nozzles 1a, 1b and 1c of the nozzle body 1 for ejecting particulate $CO_2$ are connected through respective lines 8a, 8b and 8c, as shown in FIG. 4, to a main line 16, which in turn is connected through respective lines 16a and 16b to a cleaning agent (dry ice) storage tank 11 and carrier gas storage tank 17. The carrier gas storage tank 17 stores $N_2$ gas, which carries the $CO_2$ particles to the nozzle body 1 to clean the edge and side portions of the wafer (W). The $N_2$ gas highly pressurized in the carrier gas storage tank 17 is discharged through the line 16b connected to the line 16a communicating with the cleaning agent storage tank 11 at a line connector 12.

Figure 5:
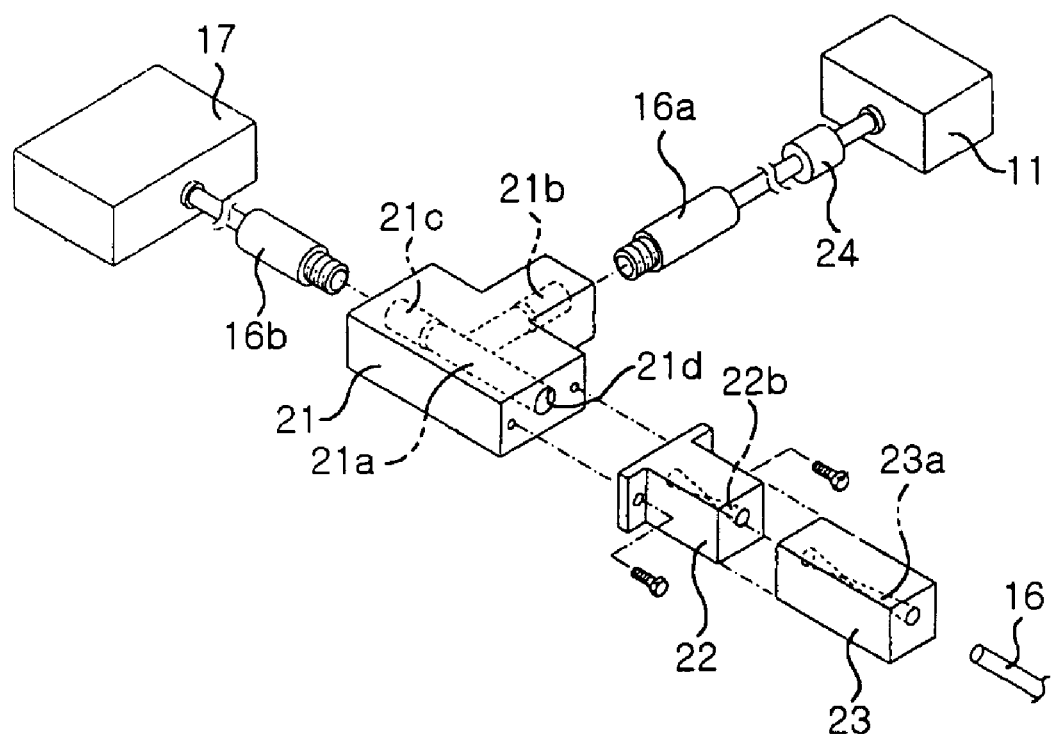
FIG. 5 is an exploded perspective view for illustrating the part connecting the cleaning agent storage tank and the carrier gas storage tank shown in FIG. 4.

FIG. 5 is a schematic exploded perspective view of the line connector connecting the cleaning agent storage tank and carrier gas storage tank shown in FIG. 4. The line connector 12, as shown in FIG. 5, includes a base block 21, and first and second orifice/venturi blocks 22 and 23. The base block 21 serves to connect the line 16a connected to the cleaning agent storage tank 11 and the line 16b connected to the carrier gas storage tank 17. Provided between the cleaning agent storage tank 11 and the line 16a is a regulator 24 for regulating the pressure of the cleaning agent stored in the cleaning agent storage tank at a high pressure to a relatively low pressure of 100 to 120 psi. Depressurized by the regulator 24, the dry ice from the cleaning agent storage tank 11 is ejected as the $CO_2$ particles in the snow state.

The base block 21 has an internal channel 21a that includes two inlet openings 21b and 21c respectively connected to the lines 16a and 16b, and one outlet opening 21d connected through the first and second orifice/venturi blocks 22 and 23 to the main line 16. The carrier gas $N_2$ from the carrier gas storage tank 17 and the cleaning agent particulate $CO_2$ from the cleaning agent storage tank 11 are mixed in the internal channel 21a of the base block 21, delivered through the first and second orifice/venturi blocks 22 and 23 and the line 16 to the nozzle body 1. The first and second orifice/venturi blocks 22 and 23 are respectively provided with internal orifice/venturi channels 22a and 23a. Thus, the particulate cleaning agent from the cleaning agent storage tank 11 passes the orifice/venturi blocks 22 and 23, more condensed and solidified to result in increase of the size of the $CO_2$ particles. Therefore, the cleaning agent of $CO_2$ particles is more condensed and solidified, carried by the carrier gas at a relatively low pressure to the nozzle body 1.

The carrier gas storage container may be a gas bomb to store highly pressurized $N_2$ gas, or a tank to store a carrier gas at a given pressure. The carrier gas such as $N_2$ may be supplied by a pump or the like to the nozzle body 1 to carry the cleaning agent such as $CO_2$ thereto.

The nozzles 1a, 1b and 1c of the nozzle body 1 may have an ejection angle selected from 1 to 120°, and the number of the first, second or third nozzles 1a, 1b or 1c may be one or more formed along the radial direction of the wafer in the nozzle body 1.

In addition, the nozzle body 1 is provided with a gas sucker 7 for sucking and treating the $CO_2$. gas vaporized due to the $CO_2$ particles impinging upon the surfaces of the wafer (W). The gas sucker 7 sucks and discharges the $CO_2$ gas together with all other gases existing around the nozzles 1a, 1b and 1c of the nozzle body and the wafer (w) after cleaning the edge and side portions of the wafer (W) in order to prevent the wafer (W) from being contaminated by such gases. Moreover, the amount and the ejection pressure of the $CO_2$ particles ejected through the nozzles 1a, 1b and 1c may be properly adjusted as needed.

In the present embodiment as shown in the attached drawings, the gas sucker 7 is provided concentrically around the first nozzle 1a, connected through a line 15 to a gas collection tank 14. The contaminated residual gas existing around the nozzle body 1 is sucked by a pump 13 provided in the line 15 collected into the gas collection tank 14. Such treatment of the residual gas including $CO_2$ serves to prevent the wafer (W) from being re-contaminated and the atmosphere from contamination by it.

In this case, the first nozzle 1a is formed of a tube with an internal diameter of 0.5 to 2 mm as described above, extended through the gas sucker 7 from the back side of the nozzle body 1 to the front, and connected to the line 8a at the back end of the tube. In addition, the second and third nozzles 1b and 1c may be perforated with the same diameter respectively in the upper and lower parts of the wafer receiver 3 of the nozzle body 1, or formed of respective tubes with the same internal diameter as the first nozzle 1a, connected to the respective lines 8b and 8c.

Figure 6A:
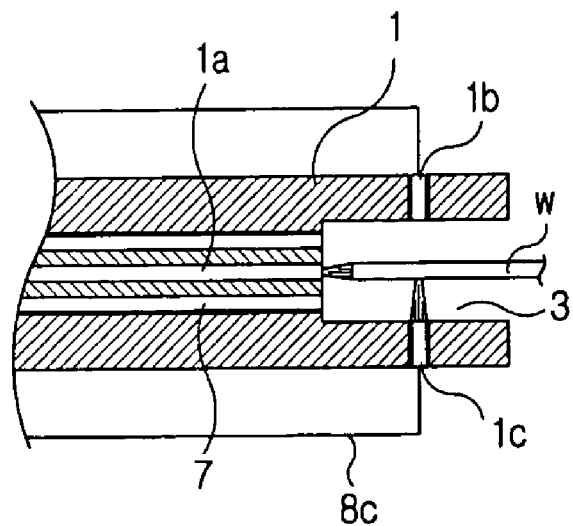
FIGS. 6A to 6C are a series of schematic cross sectional views for illustrating the sequential steps of cleaning the edge of the wafer by using the inventive apparatus for cleaning the edge of a wafer.
Figure 6B:
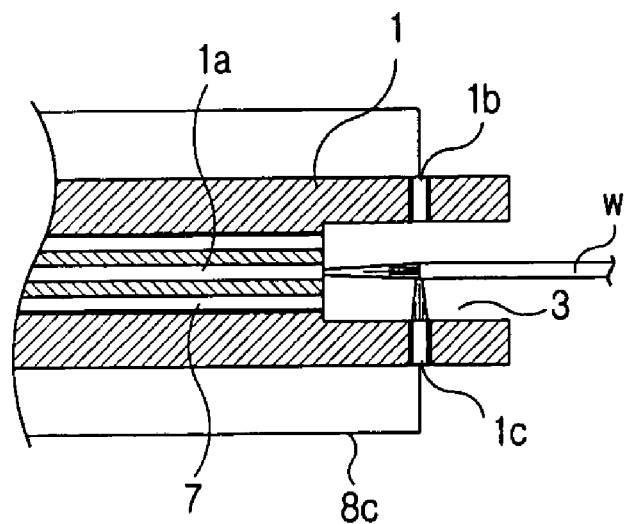
Figure 6C:
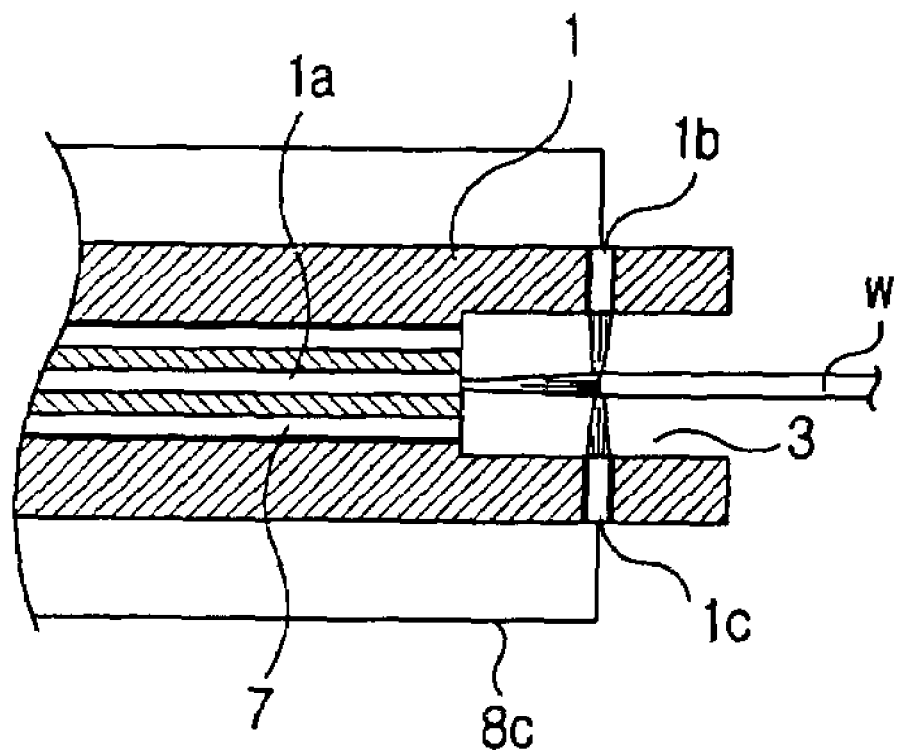

FIGS. 6A to 6C illustrates the sequential steps of cleaning the edge of the wafer by using the inventive apparatus.

Making a forward motion of the pneumatic cylinder 2 to the cleaning position for cleaning the edge of the wafer (W) as shown in FIG. 3, the first and third nozzles 1a and 1c eject the particulate $CO_2$ to clean the side and back edge portions of the wafer (W), as shown in FIG. 6A. The position at which the third nozzle 1c ejects the particulate $CO_2$ is within about 3 mm from the outer side of the wafer (W). Such cleaning of the back edge portions of the wafer (W) is to prevent the front surface of the wafer (W) from being contaminated by the contaminants that may exist in the back surface. In this case, the line 8b connected to the second nozzle 1b has a valve 9b closed so as to prevent the second nozzle 1b from ejecting the particulate $CO_2$.

Completing the cleaning of the wafer (W) at the relative position to the particulate $CO_2$ ejected from the first and third nozzles 1a and 1c as shown in FIG. 6A over a given time, the nozzle body 1 is moved about 3 mm backward by retreating the pneumatic cylinder 2 so as to position the second and third nozzles 1b and 1c respectively above and below the edge of the wafer (W) as shown in FIG. 6B while working the first and third nozzles 1a and 1c to continuously eject the particulate $CO_2$.

When the second and third nozzles 1b and 1c are positioned respectively above and below the edge of the wafer (W) by retreating the pneumatic cylinder 2, the valve 9b provided in the line 8b connected to the second nozzle 1b is opened to eject the particulate $CO_2$ along with the first and third nozzles 1a and 1c, as shown in FIG. 6C. Holding this state for a given time, the valves 9a, 9b and 9c provided in the respective lines 8a, 8b and 8c connected to the respective nozzles 1a, 1b and 1c are closed to stop the ejection of the particulate $CO_2$, and the pneumatic cylinder 2 is completely retreated to prevent the nozzle body 1 from interfering with the wafer (W).

When the pneumatic cylinder 2 has completely retreated the nozzle body 1 from the wafer (W), the edge cleaned wafer (W) is removed by a clamp or the like from the spin chuck 10 for a further processing, and another fresh wafer (W) is loaded on the spin chuck 10 by means of a vacuum force to be treated.

The inventive apparatus for cleaning the edge of the wafer as described above employs the particulate $CO_2$, and therefore, may affect the environment. Namely, the ejection of the particulate $CO_2$ of very low temperature may cause the moisture in the atmosphere to be condensed producing dew, which may be prevented by a temperature control system for controlling the temperature of the local atmosphere around the apparatus.

Besides, the pneumatic cylinder 2 and the valves 9a, 9b and 9c provided in the lines 8a, 8b and 8c are controlled by a control unit to control the whole operations of the cleaning apparatus such as holding and removing the wafer (W) by the chuck and cleaning the front and back surfaces of the wafer (W).

The inventive apparatus for cleaning the edge of a wafer as described above may also clean both the front surface and edge of the wafer (W) without affecting its front pattern.

The inventive apparatus for cleaning the edge of a wafer as described above may be relatively simply constructed with low cost, does not directly contact the wafer so as to prevent a physical damage of the wafer, and prevents the wafer from being re-contaminated by the edge cleaning, thus resulting in increase of the yield rate of wafers.

While the present invention has been described in connection with a preferred embodiment accompanied by the drawings attached only by way of example, it will be apparent to those skilled in the art that it is not limited to the above embodiment but can be variously altered or modified without departing the gist of the present invention defined in the appended claims.

What is claimed is:

1. An apparatus for cleaning the edge of a wafer, comprising:
   a cleaning agent storage tank for storing a highly pressurized cleaning agent;
   a cleaning agent ejection nozzle body connected through a first line with said cleaning agent storage tank and disposed on a side part of a chuck for ejecting a particulate cleaning agent towards the side and the edge portions of said wafer held and rotated by said chuck;
   a carrier gas storage tank connected with a second line connected to said first line for storing a carrier gas to carry the particulate cleaning agent to said nozzle body; and
   a nozzle body carriage for moving said nozzle body between rest and cleaning positions,
   wherein said nozzle body includes a wafer receiver provided on its front side configured to receive an edge portion of said wafer, a first nozzle provided on the wafer receiver substantially on the same plane as the wafer for ejecting said particulate cleaning agent directly on the edge of said wafer, a second nozzle provided in the upper part of said wafer receiver for ejecting said particulate cleaning agent towards the upper surface of said wafer, and a third nozzle provided below said second nozzle for ejecting said particulate cleaning agent towards the lower surface of said wafer, and
   wherein a line connector connecting said first and second line comprises a base block for connecting said first and second lines, and an orifice and venturi assembly provided between said base block and the nozzle body.

2. An apparatus for cleaning the edge of a wafer as defined in claim 1, wherein said ejection nozzle body further comprises a gas sucker for sucking and treating the gas vaporized from the ejected particulate cleaning agent.

3. An apparatus for cleaning the edge of a wafer as defined in claim 1, wherein said particulate cleaning agent comprises dry ice ($CO_2$) particles.

4. An apparatus for cleaning the edge of a wafer as defined in claim 1, wherein said nozzles have a diameter of 0.5 to 2 mm.

5. An apparatus for cleaning the edge of a wafer as defined in claim 1, wherein the number of each kind of said first, second and third nozzles provided in said nozzle body is two or more.

6. An apparatus for cleaning the edge of a wafer as defined in claim 1, wherein said nozzle body carriage comprises a pneumatic cylinder.

7. An apparatus for cleaning the edge of a wafer as defined in claim 1, wherein said nozzle body carriage comprises a stepper motor.

8. An apparatus for cleaning the edge of a wafer as defined in claim 1, wherein said carrier gas consists of $N_2$.

9. An apparatus for cleaning the edge of a wafer, comprising:
   a cleaning agent storage tank for storing a highly pressurized cleaning agent;
   a nozzle body connected through a first line with said cleaning agent storage tank and disposed on a side part of a spin chuck for holding and rotating said wafer so as to eject said cleaning agent converted into particles, said cleaning agent being depressurized during passing said first line;
   wherein said nozzle body includes a wafer receiver provided on its front side configured to receive an edge portion of said wafer, a first nozzle provided on the wafer receiver substantially on the same plane as the wafer for ejecting said particulate cleaning agent directly on the edge of said wafer, a second nozzle provided in the upper part of said wafer receiver for ejecting said particulate cleaning agent towards the upper surface of said wafer, and a third nozzle provided below said second nozzle for ejecting said particulate cleaning agent towards the lower surface of said wafer,
   a carrier gas storage tank connected with a second line connected to said first line for storing a carrier gas to carry the particulate cleaning agent to said nozzle body;
   a nozzle body carriage for moving said nozzle body between rest and cleaning positions; and
   a gas sucker for sucking and treating the gas vaporized from the cleaning agent ejected from said nozzle body, wherein
      a line connector connecting said first and second line comprises a base block for connecting said first and second lines, and an orifice and venturi assembly provided between said base block and said nozzle body.

* * * * *